United States Patent

Ducellier

[11] Patent Number: 6,040,938
[45] Date of Patent: Mar. 21, 2000

[54] SEMICONDUCTOR OPTICAL AMPLIFIER

[75] Inventor: Thomas Ducellier, Bures sur Yvette, France

[73] Assignee: Alcatel, Paris, France

[21] Appl. No.: 08/923,584

[22] Filed: Sep. 4, 1997

[30] Foreign Application Priority Data

Sep. 6, 1996 [FR] France .................................. 96 10898

[51] Int. Cl.[7] .............................. H01S 3/18; H01L 31/14; G02F 1/35
[52] U.S. Cl. .............................. 359/344; 359/337; 257/18
[58] Field of Search ................................... 359/248, 337, 359/344; 257/13, 18, 21; 372/43

[56] References Cited

U.S. PATENT DOCUMENTS

| | | | |
|---|---|---|---|
| 4,947,134 | 8/1990 | Olsson | 359/344 |
| 5,264,960 | 11/1993 | Glance | 359/344 |
| 5,280,383 | 1/1994 | Federic | 359/341 |
| 5,406,411 | 4/1995 | Button et al. | 359/341 |
| 5,457,811 | 10/1995 | Lemson | 359/194 |
| 5,721,637 | 2/1998 | Simon et al. | 359/344 |

FOREIGN PATENT DOCUMENTS

0620475A1  10/1994  European Pat. Off. .
1539028    1/1979   United Kingdom .

OTHER PUBLICATIONS

Patent Abstracts of Japan, vol. 018, No. 022 (E–1490), Jan. 13, 1994 corresponding to JP 05 259581 (Nippon Telgr & Telph Cor) dated Oct. 8, 1993.

P. Barnsley et al, "Wavelength Conversion from 1.3 to 1.55 um Using Split Contact Optical Amplifiers", *IEEE Photonics Technology Letters*, vol. 3, No. 3, Mar. 1, 1991, pp. 256–258.

P. Spano et al, "Frequency Conversion in Semiconductor Lasers and Amplifiers", *European Transactions on Telecommunications and Related Technologies*, vol. 5, No. 4, Jul. 1, 1994, pp. 103–113.

*Primary Examiner*—Nelson Moskowitz
*Attorney, Agent, or Firm*—Sughrue, Mion, Zinn, Macpeak & Seas, PLLC

[57] ABSTRACT

A semiconductor optical amplifier includes in integrated form a linear response attenuation segment in series between first and second amplification segments. The amplifier can be used to implement a high-speed wavelength converter that can be used with advantage in an optical telecommunication system.

9 Claims, 1 Drawing Sheet

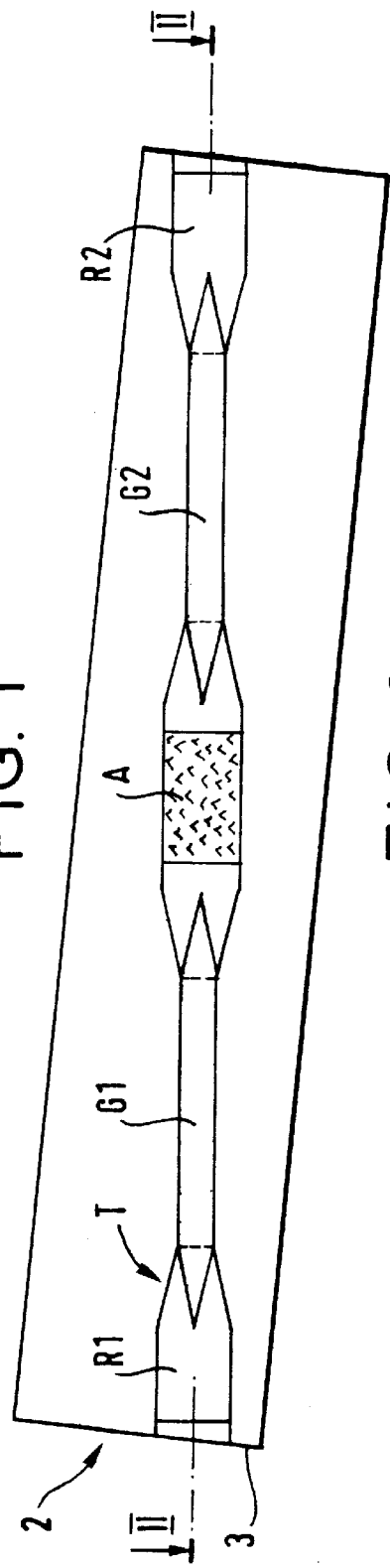
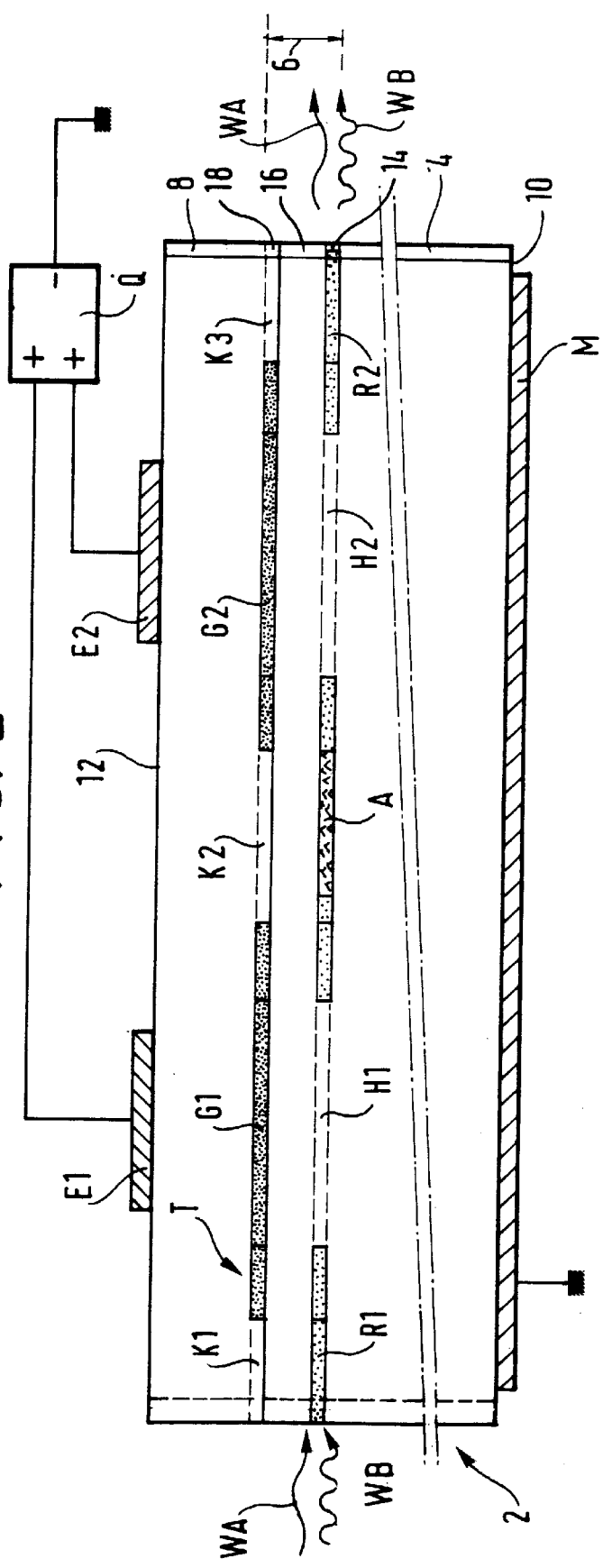

SEMICONDUCTOR OPTICAL AMPLIFIER

BACKGROUND OF THE INVENTION

1. Field of the Invention

The present invention concerns a semiconductor optical amplifier.

It finds one particular application when a signal carried by an optical wave in the form of amplitude modulation is to be carried by another optical wave, which constitutes transcription of this signal. A transcription device is then used and two waves are injected simultaneously into this device. A first wave is modulated by the signal to be transcribed. The device transcribes this signal onto the second wave.

A device of this kind can be used for wavelength conversion: in a frequency-division multiplex communication network a signal is received by one node of the network on a first spectral channel and is transmitted to the next node on a second spectral channel that may not be the same as the first. The second wave is unmodulated at the input of the device.

A device of the above kind can also be used for time-division demultiplexing or for all-optical clock recovery.

For applications such as these very high operating speeds are required. They typically correspond to a bandwidth in the order 10 GHz.

2. Description of the Prior Art

An economically advantageous way of producing a transcription device of the above kind known in itself uses a type III-V semiconductor amplifier operating near saturation. The amplitude modulation of the first wave modulates the charge carrier density in the amplifier. This density modulation leads to a corresponding modulation of the gain of this amplifier for the second lightwave. It therefore applies to this second wave amplitude modulation complementary to that of the first wave, which performs the required transcription.

In the case of the applications mentioned above, it has become apparent that the operating speed of the devices is not as great as would be desirable and is limited not only by the lifetime of the charge carriers in the amplifying medium but also because this medium is operating near saturation. This results in a lack of homogeneity in the distribution of the charge carriers over the length of the amplifier guide, this lack of homogeneity being linked to that of the longitudinal distribution of optical power. Two solutions have been considered to this problem of the intrinsic speed limitation relating to the carriers:

A first solution consists of using phase modulation in an interferometer device (of the MZ-SOA type) instead of gain modulation due to the depletion of carriers. This solution requires the implementation of an integrated interferometer incorporating at least two semiconductor amplifiers. It is technologically complex. It does not improve the component itself, but makes use of a different, faster physical effect. It is described in the following communication:

Penalty free All-optical wavelength conversion by SOAs in Mach-Zehnder Configuration, T. Durhuus et al., Ecoc'93, paper Tu C 5.2, pp.129–132.

A second solution is to employ very strong optical pumping of the amplification medium so that the equilibrium density of the carriers is reached faster. This method is effective but necessitates the costly use of a high-power third beam (called the "holding" beam). It is described in the article:

Enhanced recovery rates in semiconductor laser amplifiers using optical pumping, Manning et al., Elec. Lett., vol.30, no 10, pp.787–788, 1994.

An aim of the present invention is to provide an optical amplifier with an increased speed of operation when used as a signal transcription device.

A more general aim of the present invention is to provide a semiconductor optical amplifier such that the longitudinal distribution of the charge carrier density and/or the longitudinal distribution of the optical power density in the amplifier optical guide is better suited than previously to the use of this amplifier, especially when the medium constituting the guide has to operate near saturation.

A further aim of the present invention is to provide an amplifier of the above kind in a simple, low-cost manner and in an integrated form.

SUMMARY OF THE INVENTION

To achieve the above aims, a semiconductor optical amplifier includes in integrated form a linear response attenuation segment in series between first and second amplification segments.

Depending on the use of the amplifier, in accordance with the invention, one or both of the following two features may additionally be adopted with advantage:

The attenuation of the attenuation segment is less than the gain of the first amplification segment but sufficient to avoid saturating the gain of the second amplification segment.

The attenuation of the attenuation segment is between 0.5 dB or 1 dB and 20 dB.

One embodiment of this invention is described in more detail hereinafter, by way of example, with reference to the accompanying drawing.

BRIEF DESCRIPTION OF THE DRAWING

FIG. 1 is a plan view of the guide structure of an amplifier in accordance with this invention.

FIG. 2 shows the amplifier from FIG. 1 in section taken along a longitudinal vertical plane II—II in FIG. 1.

DETAILED DESCRIPTION OF THE PREFERRED EMBODIMENT

The amplifier shown by way of example in the above figures includes a monocrystalline semiconductor wafer 2. This wafer has a mass refractive index. It comprises the following layers or sets of stacked layers, from the bottom upwards:

A bottom confinement layer 4 having a first type of conductivity, for example n type conductivity.

A guide structure 6 including a succession of longitudinal segments having a reduced refractive index, i.e. a refractive index lower than said mass index, to constitute guide segments forming a path for lightwaves WA, WB. These are typically two lightwaves having wavelengths in the range from 1,510 nm to 1,580 nm. The path of the lightwaves includes the attenuation and amplification segments A, G1 and G2.

Finally, a top confinement layer 8 having the opposite type of conductivity to the first type, for example p type conductivity.

Electrodes E1, E2 and M are formed on the bottom face 10 and top face 12 of the wafer 2 to enable excitation currents to be passed through the wafer, injecting said charge carriers into the amplification segments from layers with the first and second types of conductivity. These currents are supplied by a current supply Q with magnitudes adapted to achieve said gains of the first and second amplification segments G1 and G2.

To be more precise, the guide structure 6 includes:

a bottom guide layer 14, an intermediate confinement layer 16 of said first conductivity type, and a top guide layer 18.

The intermediate confinement layer is sufficiently thin to enable optical coupling by evanescent waves between the top and bottom guide layers. The bottom guide layer includes, in longitudinal succession:

a first guide connection segment R1, a first non-guide gap H1, said attenuation segment A, a second non-guide gap H2, and a second guide connection segment R2.

The top guide layer includes, in longitudinal succession:

a first non-guide gap K1 superposed on the first connection segment R1, said first amplification segment G1 superposed on the first non-guide gap H1 of the bottom guide layer, a second non-guide gap K2 superposed on the attenuation segment A, said second amplification segment G2 superposed on the second non-guide gap H2 of the bottom guide layer, and a third non-guide gap K3 superposed on the second connection segment.

Said path of the lightwaves is therefore obtained by coupling by evanescent waves between the bottom guide layer 14 and the top guide layer 18. It includes a succession of guide segments comprising the first connection segment R1, the first amplification segment G1, the attenuation segment A, the second amplification segment G2 and the second connection segment R2.

The amplification segments have a width appropriate to their function. This width is less than that of the connection segments which must enable low-loss coupling to an external components such as an optical fiber. A, a transition structure T is provided for each of said couplings associating two successive guide segments. The two guide segments are an upstream segment like R1 belonging to one of the two guide layers like 14 and a downstream segment like G1 belonging to the other guide layer like 18. This transition structure occupies a transition segment common to said two guide segments. It is attained by progressive longitudinal decrease in the width of the upstream segment accompanied by a progressive longitudinal increase in the width of the downstream segment.

In FIG. 2 the areas of reduced refractive index are shown by dashed lines. In FIG. 1 the two end faces 3 of the wafer 2 are inclined to the longitudinal direction, which is that of the guide segments. As is known this inclination prevents spurious optical oscillation of the amplifier.

Various well known means can be used to obtain the required attenuation in each attenuation segment. One such means is the implantation of protons that cause dislocations in the crystal lattice, for example. These dislocations are symbolized in FIG. 1 by inverted Vs.

The wafer 2 is based on indium phosphide, for example. Ternary or quaternary alloys are used in a manner that is known in itself to constitute the guide segments.

Although the above embodiment appears advantageous, it must be understood that the amplification and attenuation segments could be in the same guide layer and that the amplifier could have two or more attenuation segments and three or more amplification segments.

In all cases each attenuation segment must partly compensate the gain of the preceding amplification segment, this gain constituting a first gain, for example, to enable the next amplification segment to also procure a power gain of the guided lightwaves, this gain constituting a second gain. This second gain enables a second transcription of a signal from a first wave to a second wave in addition to a first such transcription previously achieved in the first amplification segment. It has been found that this second transcription raises the upper limit of the transcription bandwidth. This may be because the transcriptions of the signal from the first wave to the second wave correspond to low-pass filtering. The first amplification segment corresponds to high-pass filtering for the signal carried by the first wave. At the second transcription there is then partial compensation between the low-pass filter role of the second transcription vis à vis the signal carried by the second wave and the high-pass filter role of the first amplification segment vis à vis the signal carried by the first wave.

In accordance with the present invention, it has also been found that, at least in the case of semiconductor amplifiers, which are made of type III-V materials, the first transcription is achieved correctly only if the first gain has a sufficient value and this sufficient value of the first gain is such that, if it is applied in the absence of any attenuation, the power of the lightwaves at the input of the second amplification segment would saturate this segment. The gain of the second segment would be eliminated. Insofar as the bandwidth of the overall transcription is concerned, this would lose the benefit of the second transcription.

Generally speaking, the present invention enables the attenuation of each attenuation segment to be chosen and the excitation current of each amplification segment and other parameters of the segments to be chosen, in particular their dimensions and composition. It therefore enables the most suitable charge carrier density and optical power density for a given use of an amplifier to be obtained in each amplification segment.

Moreover, the spectral curve of the gain of the second amplification segment can advantageously feature a spectral offset relative to the spectral curve of the gain of the first amplification segment. An offset of this kind is typically between 5 nm and 50 nm. It is 30 nm, for example. It flattens the spectral curve of the overall gain of the amplifier.

There is claimed:

1. A semiconductor optical amplifier including, in integrated form, a guide structure with a succession of longitudinal segments to constitute guide segments forming a path for lightwaves, said path for lightwaves including a linear response attenuation segment in series between first and second amplification segments, wherein said amplification segments are adapted to amplify said lightwaves by recombination of charge carriers with said amplification performed with local gains proportionately to local densities of said carriers and wherein attenuation by said attenuation segment is less than a gain of the first amplification segment but sufficient to avoid saturation of a gain of the second amplification segment.

2. The amplifier claimed in claim 1 wherein the attenuation of said attenuation segment is between 0.5 dB and 20 dB.

3. The amplifier claimed in claim 2 wherein said attenuation is greater than 1 dB.

4. The amplifier claimed in claim 1 including a monocrystalline semiconductor wafer having a mass reflective index and:

a bottom face, a bottom confinement layer having a first type of conductivity said guide structure including said succession of longitudinal segments having a lower refractive index to constitute said guide segments, a top confinement layer having a second type of conductivity opposite the first type, a top face, electrodes formed on said top and bottom faces of said wafer to pass through said wafer excitation currents injecting said charge carriers into said amplification segments from layers with said first and second types of conductivity, and a current supply to supply said excitation currents with magnitudes adapted to obtain said gains of said first and second amplification segments.

5. The amplifier claimed in claim 4 wherein said guide structure includes:

a bottom guide layer, an intermediate confinement layer having said first type of conductivity, and a top guide layer, said intermediate confinement layer being sufficiently thin to enable optical coupling between said top and bottom guide layers, said bottom guide layer including, in longitudinal succession:

a first guide connection segment, a first non-guide gap, said attenuation segment, a second non-guide gap, and a second guide connection segment, said top guide including, in longitudinal succession:

a first non-guide gap superposed on said first connection segment, said first amplification segment superposed on said first non-guide gap of said bottom guide layer, a second non-guide gap superposed on said attenuation segment, said second amplification segment superposed on said second non-guide gap of said bottom guide layer, and a third non-guide gap superposed on said second connection segment so that said path of said lightwaves is obtained by coupling between said top and bottom guide layers and includes a succession of said guide segments constituted by said first connection segment, said first amplification segment, said attenuation segment, said second amplification segment and said second connection segment, said amplification segments have a width less than said connection and attenuation segments, a transition being provided for each coupling between an upstream segment consisting of one of said guide segments and belonging to one of said guide layers and a downstream segment consisting of the next of said guide segments and belonging to the other of said two guide layers, said transition being achieved in a transition segment by a progressive longitudinal decrease in the width of said upstream segment with a progressive longitudinal increase in the width of said downstream segment.

6. The amplifier claimed in claim 1 wherein the spectral curve of the gain of the second amplification segment has a spectral offset relative to the spectral curve of the gain of said first amplification segment.

7. The amplifier claimed in claim 6 wherein said spectral offset is between 5 nm and 50 nm.

8. The amplifier claimed in claim 1 constituting an optical signal transcription device adapted to receive first and second lightwaves, at least said first wave being amplitude modulated by a signal, and to transcribe said signal onto said second wave, said amplifier being such that amplitude modulation of said first wave modulates the charge carrier density in said amplifier so that said density modulation brings about a corresponding modulation of the gain of said amplifier for said second lightwave and therefore applies to said second wave amplitude modulation complementary to that of said first wave.

9. An amplifier as claimed in claim 8 constituting a wavelength converter.

* * * * *